(12) United States Patent
Kanenari et al.

(10) Patent No.: US 6,753,578 B2
(45) Date of Patent: Jun. 22, 2004

(54) RESIN-SEALED SEMICONDUCTOR DEVICE

(75) Inventors: Toshiaki Kanenari, Hyogo (JP); Toshihiro Nakajima, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 78 days.

(21) Appl. No.: 10/209,859

(22) Filed: Aug. 2, 2002

(65) Prior Publication Data

US 2003/0045018 A1 Mar. 6, 2003

(30) Foreign Application Priority Data

Sep. 5, 2001 (JP) .................................. 2001-269129

(51) Int. Cl.⁷ .............................................. H01L 27/01
(52) U.S. Cl. ...................... 257/359; 257/380; 257/541; 438/330; 438/382
(58) Field of Search ................................ 257/359, 380, 257/541, 571, 581; 438/329, 330, 343, 382

(56) References Cited

U.S. PATENT DOCUMENTS 6,037,844 A * 3/2000 Makino et al. ............... 60/785

FOREIGN PATENT DOCUMENTS

JP          56-167336          12/1981

* cited by examiner

Primary Examiner—Dung Le
(74) Attorney, Agent, or Firm—Oblon, Spivak, McClelland, Maier & Neustadt, P.C.

(57) ABSTRACT

A resin-sealed semiconductor device is provided which allows unwanted air to be bled out steadily and readily from the space defined between the resistor of a plate-like shape and the insulating substrate in the resin sealing step. The resin-sealed semiconductor device includes a resistor of a plate-like form anchored at both ends to the upper main surface of a substrate thereof. A space is provided between the resistor and the substrate. The primary components including the resistor mounted on the substrate are sealed with a curing resin material. In particular, the resistor has an aperture provided in a portion thereof, which is opposite to the substrate and defines the space with the substrate, for communication between the space and the upper side of the resistor.

7 Claims, 6 Drawing Sheets

RESIN-SEALED SEMICONDUCTOR DEVICE

BACKGROUND OF THE INVENTION

1. Field of the Invention

The present invention relates to a resin-sealed semiconductor device.

2. Description of the Related Art

As well known, a semiconductor power device such as an intelligent power module for use in a power source incorporated in an inverter device for household electrical or industrial appliances, comprises primary components such as power chips and control ICs provided on the upper surface of a substrate which is supported in an enclosure, and generally sealed with a curing resin material for protection against an external environment.

FIG. 10 is a plan view schematically showing a conventional resin-sealed semiconductor power device before being sealed with a resin material. The semiconductor power device 80 has an IGBT 83 as a power chip, a FWDi (Free Wheel Diode) 84, and a control IC 85 provided on an insulating substrate 82 which is supported in an enclosure 81. In addition, provided on the upper main surface of the insulating substrate 82 is a milliohm resistor 86 of a plate-like shape. The enclosure 81 is equipped with a set of external connection terminals 87 which is insert formed. Also, bonding wires are provided on the upper main surface of the insulating substrate 82, as well as circuit patterns, for electrical connection between the components but not shown in FIG. 10 for simplicity of the description.

FIG. 11 is a longitudinal cross sectional view of the milliohm resistor 86 taken along the line C—C of FIG. 10. The milliohm resistor 86 is arranged of generally a raised form of its plate-like material which is anchored at both ends (denoted by 86b) to the insulating substrate 82. Accordingly, a space 90 is provided as defined between the milliohm resistor 86 and the upper main surface 82a of the insulating substrate 82. A raised portion 86a of the milliohm resistor 86 extends in parallel with the insulating substrate 82.

The components on the insulating substrate 82 are sealed with a curing resin 92 for protection against the external environment as shown in FIG. 12. However, as the milliohm resistor 86 and the enclosure 81 of the semiconductor power device 80 are located adjacent to each other in the resin sealing step, the space 90 defined between the milliohm resistor 86 and the insulating substrate 82 may hardly be filled with the resin 92 but bubbles of air. When the air escapes from the space 90 during the curing of the resin, it may produce a void(s) 92a at the surface in the resin 92. Otherwise, the air trapped in the space 90 may decline the thermal conductivity of the milliohm resistor 86 and thus prevent the milliohm resistor 86 from releasing a redundancy of heat.

SUMMARY OF THE INVENTION

It is an object of the present invention to provide a resin-sealed semiconductor device which allows unwanted air to be bled out steadily and readily from the space defined between the resistor of a plate-like shape and the insulating substrate in the resin sealing step.

A resin-sealed semiconductor device in an aspect of the present invention includes a resistor of a plate-like form placed and anchored at both ends onto the upper main surface of a substrate, providing a space between the resistor and the substrate. The primary components including said resistor on the substrate are sealed with a curing resin material. In this resin-sealed semiconductor device, the resistor includes a portion which is opposite to the substrate and defines the space with the substrate, and an aperture is formed in said portion for communication between the space and the upper side of the resistor.

Accordingly, an air can be prevented from entrapping in the space during the resin packaging step. As a result, the generation of voids in the resin when cured can be prevented. Also, as its aperture and space are steadily filled with the resin, the resistor remains high in the thermal conductivity and can thus be inhibited from generating overheat.

Said aperture is located at substantially the center of said portion of the resistor. This allows unwanted air to be effectively bled from the space.

A roughness of a surface facing the substrate (that is, a lower surface) in said portion of the resistor is set to 2S or lower. This also allows unwanted air to be effectively bled from the space with much ease.

DETAILED DESCRIPTION OF THE INVENTION

Some embodiments of the present invention will be described in more detail referring to the accompanying drawings.

First Embodiment

Figure 1:
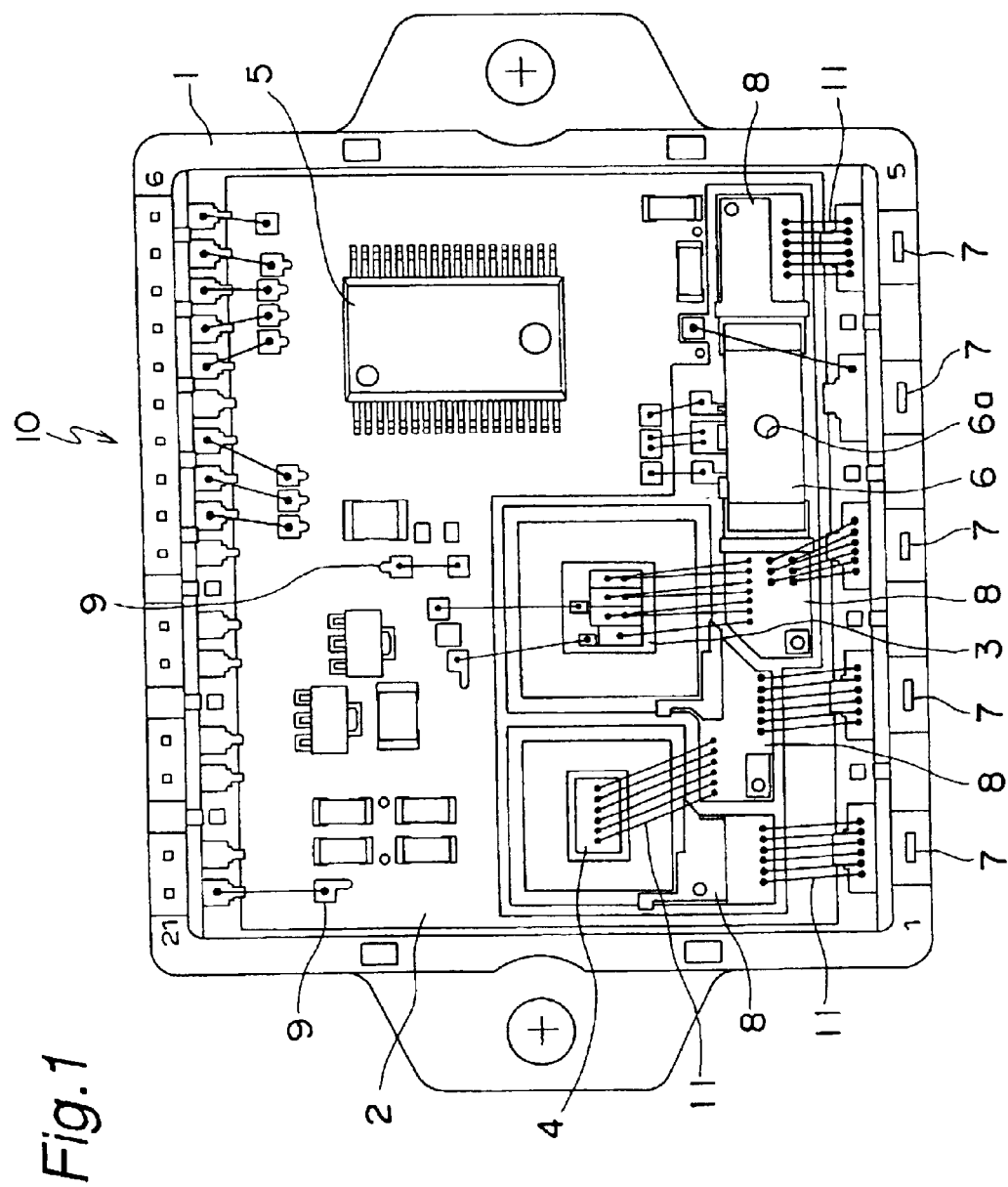
FIG. 1 is a plan view illustrating a semiconductor power device before being resin-sealed according to first embodiment of the present invention.

FIG. 1 is a plan view schematically showing a resin-sealed semiconductor power device before being sealed with a resin material, according to first embodiment of the present invention. The semiconductor power device 10 has an insulating substrate 2 supported in an enclosure 1. Provided on the upper main surface of the insulating substrate 2 are an IGBT 3 as a power chip, a FWDi 4, and a control IC 5. Also, a pattern of circuits 8 and electrodes 9 are provided beside the components on the upper main surface of the insulating substrate 2. Moreover, a milliohm resistor 6 of a plate-like form is provided on the upper main surface of the insulating substrate 2 for detecting currents in the semiconductor power device 10 on a bus thereof.

The enclosure 1 has a set of external connection terminals 7 provided by insert forming. Each of external connection terminals 7 is exposed inside of enclosure 1 at one end, and is projected towards the outside of the enclosure 1 at the other end for connection to relevant external components (not shown). The external connection terminals 7 are electrically connected at the inner end by aluminum wires 11 to the components provided on the upper main surface of the insulating substrate 2.

The components on the upper main surface of the insulating substrate 2, the external connection terminals 7, and the aluminum wires 1 of the resin-sealed semiconductor device 10 are sealed with the curing resin for protection against the external environment. While bubbles of air are often trapped in the space between the milliohm resistor and the insulating substrate during the resin sealing step in the prior art, they can be eliminated by the following advantage of the present invention.

Figure 2:
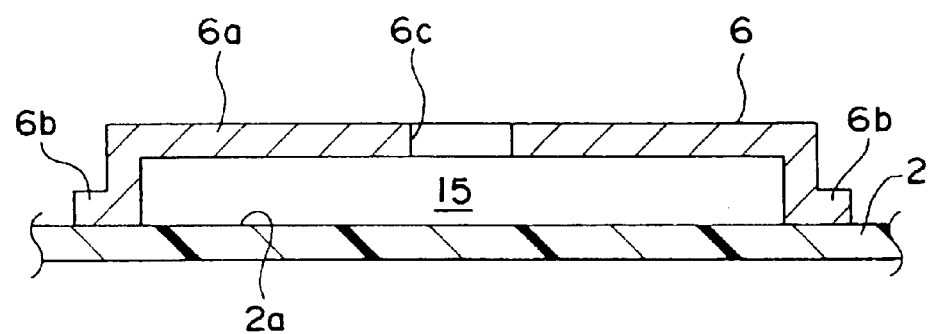
FIG. 2 is a longitudinal cross sectional view illustrating a resistor provided on the upper main surface of an insulating substrate according to first embodiment of the present invention.
Figure 3:
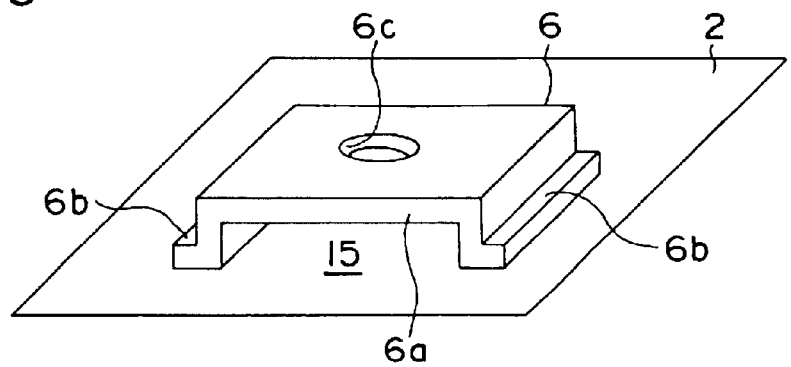
FIG. 3 is a perspective view illustrating said resistor provided on the upper main surface of the insulating substrate.

FIGS. 2 and 3 are a longitudinal cross sectional view and a perspective view of the milliohm resistor 6 respectively. The milliohm resistor 6 is arranged of generally a raised plate-like form which is anchored at both ends (denoted by 6b) to the insulating substrate 2, providing a space 15 defined between the milliohm resistor 6 and the upper main surface 2a of the insulating substrate 2. A raised portion 6a (referred to as an opposite portion hereinafter) of the milliohm resistor 6 located opposite to the insulating substrate 2 thus defining the space 15 extends flat and parallel with the insulating substrate 2.

The milliohm resistor 6 of first embodiment has an aperture 6c provided in the opposite portion 6a thereof. The aperture 6c is a through hole extending in the thickness direction of the opposite portion 6a to communicate between the space 15 and the upper side of the milliohm resistor 6. The aperture 6c is located at the center of the opposite portion 6a. The milliohm resistor 6 may be made of a copper-nickel alloy.

The milliohm resistor 6 allows the air trapped in the space 15 to be moved out from both sides of the opposite portion 6a and upwardly from the aperture 6c as the curing resin is injected in the resin sealing step. As a result, the air bleed from the space 15 can be conducted readily and steadily. After the resin sealing process, the aperture 6c is filled with the resin. In this manner, as the air is not allowed to entrap in the space 15 during the resin sealing step, the generation of voids in the resin can successfully be avoided. Also, as its aperture 6c and space 15 are filled with the resin, the milliohm resistor 6 remains high in the thermal conductivity and can thus be inhibited from generating overheat. Moreover, as the aperture 6c is located at the center of the opposite portion 6a, it allows the air trapped in the space 15 to be effectively bled out through.

For bleeding the air from the space 15 more readily and steadily, the opposite portion 6a of the milliohm resistor 6 may be smoothed in the roughness (e.g. 2S or lower) of the lower surface facing the insulating substrate 2. This minimizes the resistance of the lower surface facing the insulating substrate 2 of the milliohm resistor 6 and can thus allow the air trapped in the space 15 to be moved smoothly and bled out more rapidly and steadily.

The material of the milliohm resistor 6 is not limited to the copper-nickel alloy but may be any other appropriate material such as manganin-containing alloy which is known for a low resistance change based on a temperature coefficient.

Described below are other embodiments of the present invention where like components are denoted by like numerals as those of first embodiment and will be explained in no more detail.

Second Embodiment

Figure 4:
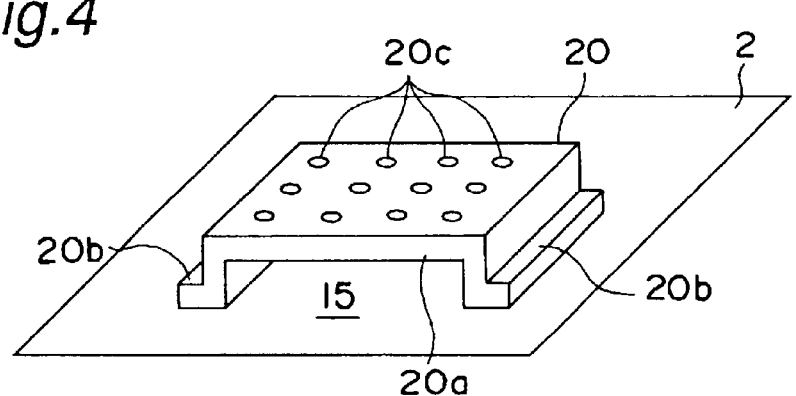
FIG. 4 is a perspective view illustrating a resistor according to second embodiment of the present invention.

FIG. 4 is a perspective view illustrating a milliohm resistor according to second embodiment of the present invention. The milliohm resistor 20 is substantially identical in the construction to that of first embodiment and its raised plate-like portion is anchored at both ends (denoted by 20b) to an insulating substrate 2, providing a space 15 defined between the milliohm resistor 20 and the upper main surface of the insulating substrate 2. The raised portion 20a (referred to as an opposite portion) of the milliohm 20 defining the space 15 with the insulating substrate 2 extends flat and parallel to the insulating substrate 2.

The flat opposite portion 20a of the milliohm resistor 20 has an array of apertures 20c provided therein at equal intervals. The apertures 20c are through holes extending in thickness direction of the opposite portion 20a for communication between the space 15 and the upper side of the milliohm resistor 20. The apertures 20c may be sized to a proper diameter (e.g. 0.1 mm) or smaller. The milliohm resistor 20 may be made of a copper-nickel alloy like that of first embodiment as described above.

The milliohm resistor 20 of second embodiment also allows the air trapped in the space 15 to be moved out from both sides of the opposite portion 20a and upwardly from the apertures 20c as a curing resin is injected in the resin sealing step. As a result, the air bleeding can be conducted readily and steadily. After the resin sealing process, the apertures 20c are filled with the resin. In this manner, as the air is not allowed to remain in the space 15 during the resin sealing step, the generation of voids in the resin can successfully be avoided. Also, as its apertures 20c and space 15 are filled with the resin, the milliohm resistor 20 remains high in the thermal conductivity and can thus be inhibited from generating overheat.

For bleeding the air from the space 15 more readily and steadily, the opposite portion 20a of the milliohm resistor 20 may be smoothed in the roughness (e.g. 2S or lower) of the lower surface facing the insulating substrate 2. This minimizes the resistance of the lower surface facing the insulating substrate 2 of the milliohm resistor 20 and can thus allow the air trapped in the space 15 to be moved smoothly and bled out more rapidly and steadily.

The material of the milliohm resistor 20 is not limited to the copper-nickel alloy but may be made any other appropriate material such as manganin-containing alloy which is known for a low resistance change based on a temperature coefficient.

Third Embodiment

Figure 5:
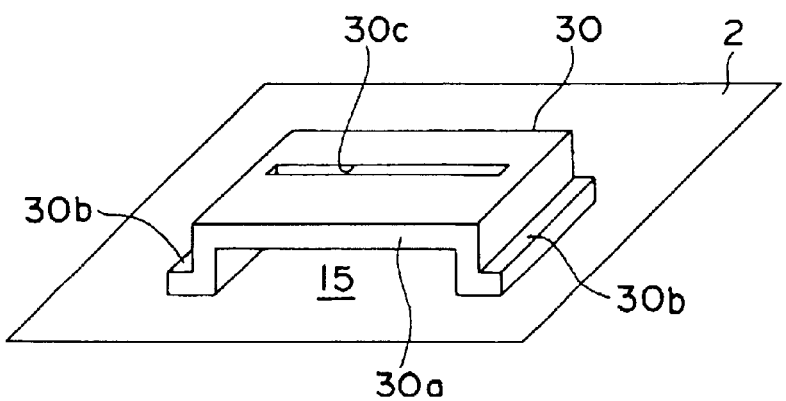
FIG. 5 is a perspective view illustrating a resistor according to third embodiment of the present invention.

FIG. 5 is a perspective view illustrating a milliohm resistor according to third embodiment of the present invention. The milliohm resistor 30 is substantially identical in the construction to that of first embodiment and its raised plate-like portion is anchored at both ends (denoted by 30b) to an insulating substrate 2, providing a space 15 defined between the milliohm resistor 30 and the upper main surface of the insulating substrate 2. The raised portion 30a (referred to as an opposite portion) of the milliohm resistor 30 defining the space 15 with the insulating substrate 2 extends flat and parallel to the insulating substrate 2.

The flat opposite portion 30a of the milliohm resistor 30 according to third embodiment has a slit 30c formed therein extending in the longitudinal direction of the opposite portion 30a. The slit 30c is a through hole extending in the thickness direction of the opposite portion 30a for communication between the space 15 and the upper side of the milliohm resistor 30. The slit 30c is located at substantially the center of the opposite portion 30a along both the lengthwise and widthwise directions. The milliohm resistor 30 may be made of a copper-nickel alloy like that of first embodiment as described above.

The milliohm resistor 30 allows the air trapped in the space 15 to be moved out from both sides of the opposite portion 30a and upwardly from the slit 30c as the cuirng resin is injected in the resin sealing step. As a result, the air bleeding can be conducted readily and steadily. After the resin sealing process, the slit 30c is filled with the resin. In this manner, as the air is not allowed to remain in the space 15 during the resin sealing step, the generation of voids in the resin can successfully be avoided. Also, as its slit 30c and space 15 are filled with the resin, the milliohm resistor 30 remains high in the thermal conductivity and can thus be inhibited from generating overheat. Moreover, as the slit 30c is located at the center of the opposite portion 30a, it allows the air trapped in the space 15 to be effectively bled out through.

For bleeding the air from the space 15 more readily and steadily, the opposite portion 30a of the milliohm resistor 30 may be smoothed in the roughness (e.g. 2S or lower) of the lower surface facing the insulating substrate 2. This minimizes the resistance of the lower surface facing the insulating substrate 2 of the milliohm resistor 20 and can thus allow the air trapped in the space 15 to be moved smoothly and bled out more rapidly and steadily.

The material of the milliohm resistor 30 is not limited to the copper-nickel alloy but may be any other appropriate material such as manganin-containing alloy which is known for a low resistance change based on a temperature coefficient.

Fourth Embodiment

Figure 6:
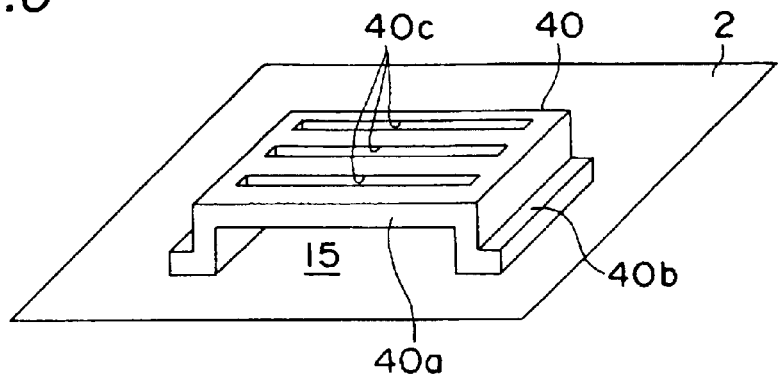
FIG. 6 is a perspective view illustrating a resistor according to fourth embodiment of the present invention.

FIG. 6 is a perspective view illustrating a milliohm resistor according to embodiment of the present invention. The milliohm resistor 40 is substantially identical in the construction to that of third embodiment and its raised plate-like portion is anchored at both ends (denoted by 40b) to an insulating substrate 2, providing a space 15 defined between the milliohm resistor 40 and the upper main surface of the insulating substrate 2. The raised portion 40a (referred to as an opposite portion) of the milliohm resistor 40 defining the space 15 with the insulating substrate 2 extends flat and parallel to the insulating substrate 2.

The flat opposite portion 40a of the milliohm resistor 40 of fourth embodiment has a plurality of slits 40c provided therein extending in the longitudinal direction of the opposite portion 40a and in parallel to one another. The slits 40c are through holes extending in the thickness direction of the opposite portion 40a for communication between the space 15 and the upper side of the milliohm resistor 40. The milliohm resistor 40 may be made of a copper-nickel alloy like that of first embodiment as described above.

The milliohm resistor 40 of fourth embodiment also allows the air trapped in the space 15 to be moved out from both sides of the opposite portion 40a and upwardly from the slits 40c as a curing resin is injected in the resin sealing step. As a result, the air bleeding can be conducted readily and steadily. After the resin sealing process, the slits 40c are filled with the resin. In this manner, as the air is not allowed to remain in the space 15 during the resin sealing step, the generation of voids in the resin can successfully be avoided. Also, as its slits 40c and space 15 are filled with the resin, the milliohm resistor 40 remains high in the thermal conductivity and can thus be inhibited from generating overheat.

For bleeding the air from the space 15 more readily and steadily, the opposite portion 40a of the milliohm resistor 40 may be smoothed in the roughness (e.g. 2S or lower) of the lower surface facing the insulating substrate 2. This minimizes the resistance of the lower surface facing the insulating substrate 2 of the milliohm resistor 40 and can thus allow the air trapped in the space 15 to be moved smoothly and bled out more rapidly and steadily.

The material of the milliohm resistor 40 is not limited to the copper-nickel alloy but may be any other appropriate material such as manganin-containing alloy which is known for a low resistance change based on a temperature coefficient.

Fifth Embodiment

Figure 7:
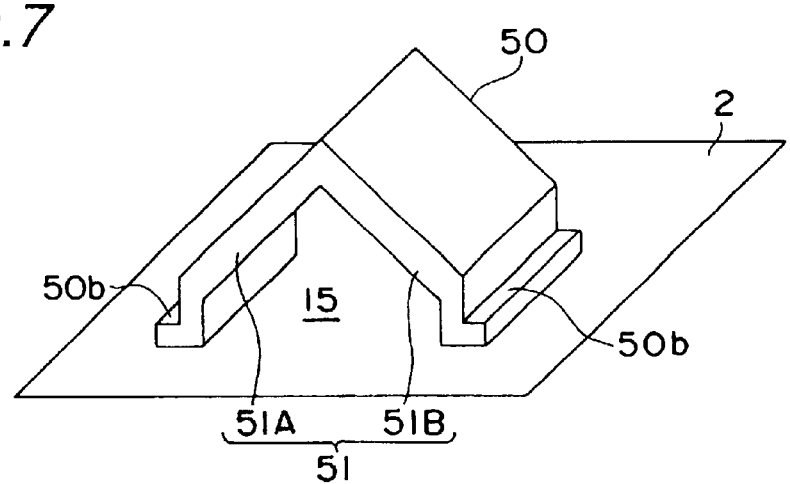
FIG. 7 is a perspective view illustrating a resistor according to fifth embodiment of the present invention.

FIG. 7 is a perspective view illustrating a milliohm resistor according to fifth embodiment of the present invention. The milliohm resistor 50 is arranged of a gabled plate-like form which is anchored at both ends (denoted by 50b) to an insulating substrate 2, providing a space 15 defined between the milliohm resistor 50 and the upper main surface of the insulating substrate 2.

A plate-like portion 51 (referred to as an opposite portion) of the milliohm resistor 50 defining the space 15 with the insulating substrate 2 is downwardly bent at a lengthwise intermediate portion (the center in this embodiment) to have a gabled shape. More particularly, the opposite portion 51 of the milliohm resistor 50 comprises a pair of tilted halves 51A and 51B tilted inwardly at an angle to the upper main surface of the insulating substrate 51 and intersected with each other. The milliohm resistor 50 may be made of a copper-nickel alloy like that of first embodiment as described above.

The milliohm resistor 50 also allows the air trapped in the space 15 to be moved upward along the tilted halves 51A and 51B and discharged from both sides of the opposite portion 51 as a curing resin is injected in the resin sealing step. As a result, the air bleeding can be conducted readily and steadily. In this manner, as the air is not allowed to remain in the space 15 during the resin sealing step, the generation of voids in the resin can successfully be avoided. Also, as the space 15 is filled with the resin, the milliohm resistor 50 remains high in the thermal conductivity and can thus be inhibited from generating overheat.

For bleeding the air from the space 15 more readily and steadily, the opposite portion 51 of the milliohm resistor 50 may be smoothed in the roughness (e.g. 2S or lower) of the lower surface facing the insulating substrate 2. This minimizes the resistance of the lower surface facing the insulating substrate 2 of the milliohm resistor 50 and can thus allow the air trapped in the space 15 to be moved smoothly and bled out more rapidly and steadily.

The material of the milliohm resistor 50 is not limited to the copper-nickel alloy but may be any other appropriate material such as manganin-containing alloy which is known for a low resistance change based on a temperature coefficient.

Sixth Embodiment

Figure 8:
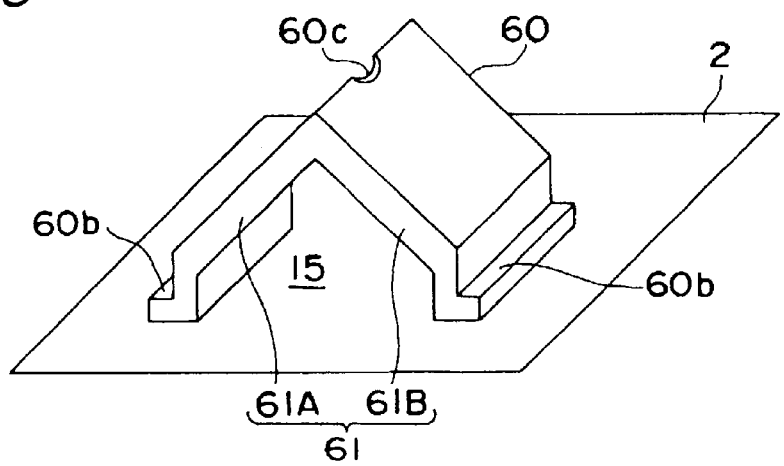
FIG. 8 is a perspective view illustrating a resistor according to sixth embodiment of the present invention.

FIG. 8 is a perspective view illustrating a milliohm resistor according to sixth embodiment of the present invention. The milliohm resistor 60 is substantially identical in the construction to that of fifth embodiment as arranged of a gabled plate-like form anchored at both ends (denoted by 60b) to an insulating substrate 2, providing a space 15 defined between the milliohm resistor 60 and the upper main surface of the insulating substrate 2.

The milliohm resistor 60 of sixth embodiment has an aperture 60c provided in a gabled portion 61 thereof (referred to as an opposite portion), which defines the space 15 with the insulating substrate 2, at the intersectional portion between two tilted halves 61A and 61B of the opposite portion 61. The aperture 60c is a through hole penetrating through the opposite portion 61 for communication between the space 15 and the upper side of the milliohm resistor 60. The aperture 60c is located at the center along the widthwise direction of the opposite portion 61. The milliohm resistor 60 may be made of a copper-nickel alloy like that of first embodiment as described above.

The milliohm resistor 60 of sixth embodiment also allows the air trapped in the space 15 to be moved upward along the tilted halves 61A and 61B and discharged from both sides of the opposite portion 61 and from the aperture 60c as a curing resin is injected in the resin sealing step. As a result, the air bleeding can be conducted readily and steadily. After the resin sealing step, the aperture 60c is filled with the resin. In this manner, as the air is not allowed to remain in the space 15 during the resin sealing step, the generation of voids in the resin can successfully be avoided. Also, as its aperture 60c and space 15 are filled with the resin, the milliohm resistor 60 remains high in the thermal conductivity and can thus be inhibited from generating overheat. Furthermore, as the aperture 60c is provided in the center along the widthwise direction of the opposite portion 61, it allows the air to be effectively bled from the space 15.

For bleeding the air from the space 15 more readily and steadily, the opposite portion 61 of the milliohm resistor 60 may be smoothed in the roughness (e.g. 2S or lower) of the lower surface facing the insulating substrate 2. This minimizes the resistance of the lower surface facing the insulating substrate 2 of the milliohm resistor 60 and can thus allow the air trapped in the space 15 to be moved smoothly and bled out more rapidly and steadily.

The material of the milliohm resistor 60 is not limited to the copper-nickel alloy but may be any other appropriate material such as manganin-containing alloy which is known for a low resistance change based on a temperature coefficient.

Seventh Embodiment

Figure 9:
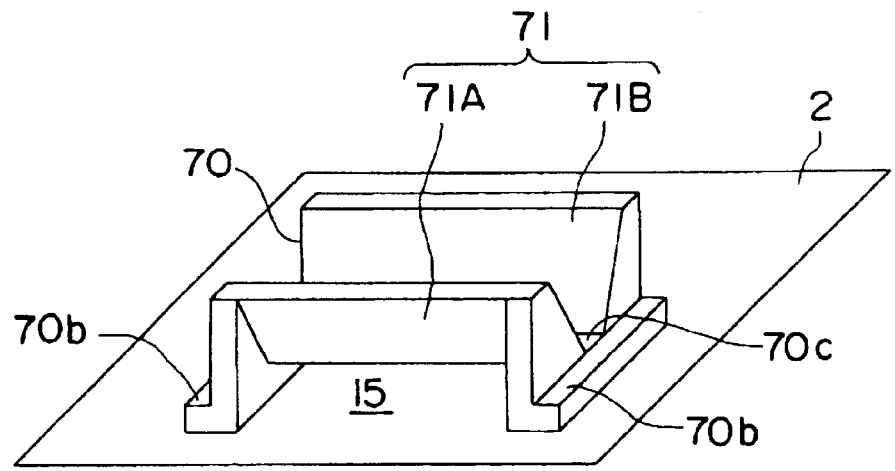
FIG. 9 is a perspective view illustrating a resistor according to seventh embodiment of the present invention.
Figure 10:
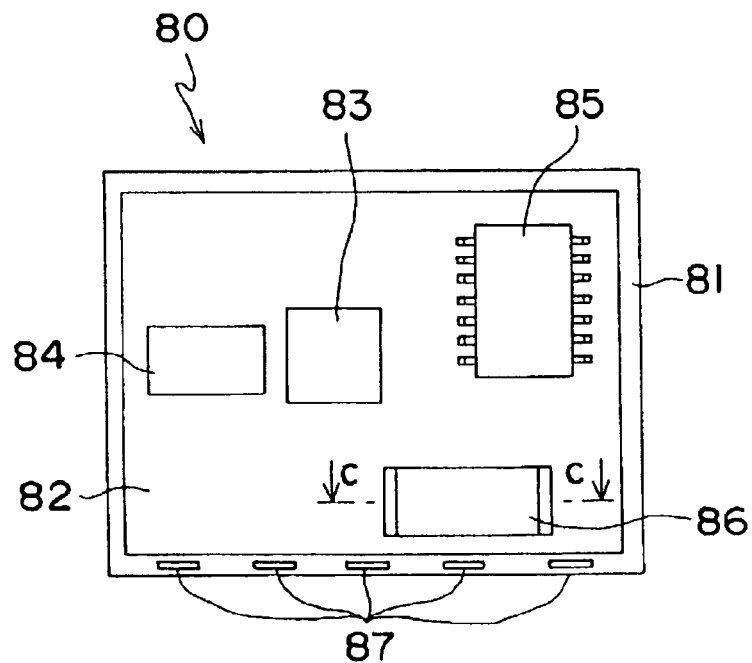
FIG. 10 is a plan view schematically illustrating a conventional semiconductor power device before being resin-sealed.
Figure 11:
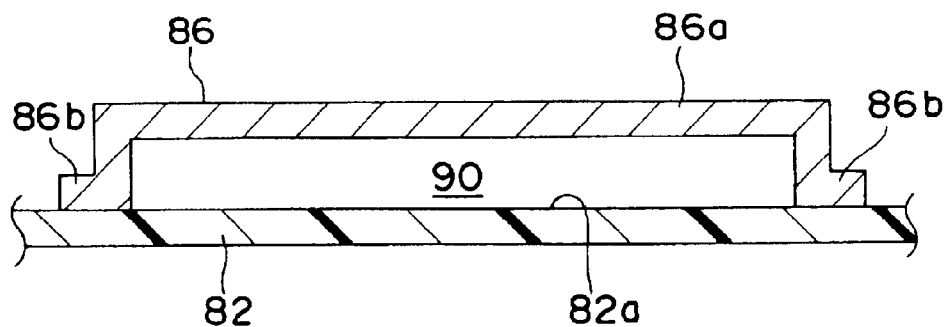
FIG. 11 is a longitudinal cross sectional view illustrating a resistor provided on the upper main surface of an insulating substrate of the conventional semiconductor power device.
Figure 12:
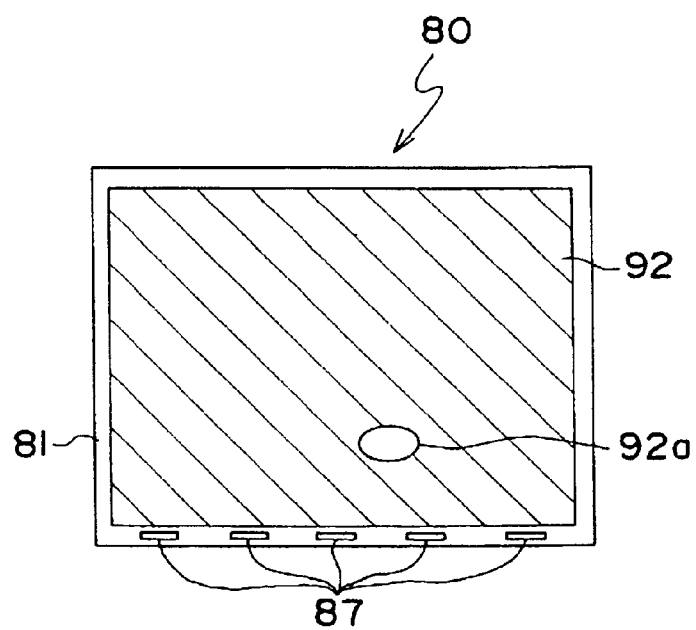
FIG. 12 is a plan view schematically illustrating the conventional semiconductor device after being resin-sealed.

FIG. 9 is a perspective view illustrating a milliohm resistor according to seventh embodiment of the present invention. The milliohm resistor 70 is anchored at both ends (denoted by 70b) to an insulating substrate 2, providing a space 15 is provided as defined between the milliohm resistor 70 and the upper main surface of the insulating substrate 2.

A V-shaped portion 71 (referred to as an opposite portion) of the milliohm resistor 70 which defines the space 15 with the insulating substrate 2 extends in the longitudinal direction of the milliohm resistor 70. More specifically, the opposite portion 71 of the milliohm resistor 70 comprises a pair of tilted halves 71A and 71B tilted outwardly at an angle to the upper main surface of the insulating substrate 2 while extending in the longitudinal direction of the milliohm resistor 70. The two halves 71A and 71B of the milliohm resistor 70 are spaced from each other so as to provide a slit 70c therebetween extending in the longitudinal direction at the bottom of the V shape portion. The milliohm resistor 70 may be made of a copper-nickel alloy like that of first embodiment as described above.

The milliohm resistor 70 of seventh embodiment also allows the air trapped in the space 15 to be moved upward along the tilted halves 71A and 71B before dispersed outwardly at the top and also discharged through the slit 70c at the bottom as a curing resin is injected in the resin sealing step. As a result, the air bleeding can be conducted readily and steadily. In this manner, as the air is not allowed to remain in the space 15 during the resin sealing step, the generation of voids in the resin can successfully be avoided. Also, as its slit 70c and space 15 are filled with the resin, the milliohm resistor 70 remains high in the thermal conductivity and can thus be inhibited from generating overheat.

For bleeding the air from the space 15 more readily and steadily, the opposite portion 71 of the milliohm resistor 70 may be smoothed in the roughness (e.g. 2S or lower) of the lower surface facing the insulating substrate 2. This minimizes the resistance of the lower surface facing the insulating substrate 2 of the milliohm resistor 70 and can thus allow the air trapped in the space 15 to be moved smoothly and bled out more rapidly and steadily.

The material of the milliohm resistor 70 is not limited to the copper-nickel alloy but may be any other appropriate material such as manganin-containing alloy which is known for a low resistance change based on a temperature coefficient.

It would be understood that the present invention is not limited to the foregoing embodiments but various changes and modifications in design are possible without departing from the scope of the present invention. For example, the substrate in the embodiments is not limited to the insulating substrate 2 but may be implemented by any other appropriate member such as a lead frame.

What is claimed is:

1. A resin-sealed semiconductor device comprising a resistor of a plate-like form placed and anchored at both ends onto the upper main surface of a substrate providing a space between the resistor and the substrate, the resistor together with the other primary components on the substrate being sealed with a curing resin material, wherein the resistor has a portion which is opposite to the substrate and defines the space with the substrate, and at least an aperture is formed in said portion for communication between the space and the upper side of the resistor.

2. The resin-sealed semiconductor device according to claim 1, wherein the aperture is located at substantially the center of said portion of the resistor.

3. The resin-sealed semiconductor device according to claim 1, wherein a roughness of a surface facing the substrate in said portion of the resistor is set to 2S or lower.

4. A resin-sealed semiconductor device comprising a resistor of a plate-like form placed and anchored at both ends onto the upper main surface of a substrate providing a space between the resistor and the substrate, the resistor together with the other primary components on the substrate being sealed with a curing resin material, wherein the resistor has a portion which is opposite to the substrate and defines the space with the substrate, the portion comprising tilted halves tilted at an angle to the upper main surface of the substrate.

5. The resin-sealed semiconductor device according to claim 4, wherein an aperture is formed in said portion for communication between the space and the upper side of the resistor.

6. The resin-sealed semiconductor device according to claim 4, wherein the aperture is located at substantially the center of said portion of the resistor.

7. The resin-sealed semiconductor device according to claim 4, wherein a roughness of a surface facing the substrate in said portion of the resistor is set to 2S or lower.

* * * * *